United States Patent
Sekiguchi et al.

(10) Patent No.: US 8,617,418 B2
(45) Date of Patent: Dec. 31, 2013

(54) CONDUCTIVE FILM REMOVAL AGENT AND CONDUCTIVE FILM REMOVAL METHOD

(75) Inventors: Hiroki Sekiguchi, Shinga (JP); Junji Mata, Shiga (JP)

(73) Assignee: Toray Industries, Inc., Otsu, Shiga (JP)

( * ) Notice: Subject to any disclaimer, the term of this patent is extended or adjusted under 35 U.S.C. 154(b) by 69 days.

(21) Appl. No.: 13/262,454

(22) PCT Filed: Mar. 25, 2010

(86) PCT No.: PCT/JP2010/055178
§ 371 (c)(1),
(2), (4) Date: Sep. 30, 2011

(87) PCT Pub. No.: WO2010/113744
PCT Pub. Date: Oct. 7, 2010

(65) Prior Publication Data
US 2012/0031872 A1    Feb. 9, 2012

(30) Foreign Application Priority Data

Mar. 30, 2009  (JP) .................................. 2009-081411
Nov. 19, 2009  (JP) .................................. 2009-263510

(51) Int. Cl.
*C09K 13/00*    (2006.01)

(52) U.S. Cl.
USPC .......... 252/79.4; 252/79.1; 438/693; 216/108

(58) Field of Classification Search
USPC ......... 438/691, 692, 693, 694, 745; 252/79.1, 252/79.2, 79.3, 79.4; 216/89, 90, 108
See application file for complete search history.

(56) References Cited

U.S. PATENT DOCUMENTS

| | | | |
|---|---|---|---|
| 2004/0134873 A1* | 7/2004 | Yao et al. | 216/2 |
| 2005/0084613 A1* | 4/2005 | Wang et al. | 427/282 |
| 2008/0254717 A1* | 10/2008 | Fukasawa et al. | 451/36 |
| 2009/0032777 A1 | 2/2009 | Kitano et al. | |

FOREIGN PATENT DOCUMENTS

| | | |
|---|---|---|
| JP | 01-1147078 A | 6/1989 |
| JP | 08-817789 A | 1/1996 |
| JP | 09-941162 A | 2/1997 |
| JP | 2000-309888 | 11/2000 |
| JP | 2002-066007 | 9/2002 |
| JP | 2004-176115 A | 6/2004 |

(Continued)

OTHER PUBLICATIONS

International Search Report in related application PCT/JP2010/055178 dated Jun. 22, 2010.

(Continued)

*Primary Examiner* — Lan Vinh
(74) *Attorney, Agent, or Firm* — Pillsbury Winthrop Shaw Pittman LLP

(57) ABSTRACT

Disclosed is an agent for removing a conductive film, which contains: an acid having a boiling point of 80° C. or higher, a base having a boiling point of 80° C. or higher, or a compound which generates an acid or a base by external energy in combination with a solvent, a resin, and a leveling agent. Also disclosed is a method for removing a conducting film, which uses the agent for removing a conductive film. The agent for removing a conductive film and the method for removing a conductive film are capable of in-place uniformity removing a desired portion of a conductive film.

11 Claims, 1 Drawing Sheet

(56) References Cited

FOREIGN PATENT DOCUMENTS

| | | |
|---|---|---|
| JP | 2004-256901 | 9/2004 |
| JP | 2006-135282 A | 5/2006 |
| JP | 2009-503825 A | 2/2007 |
| JP | 2007-115431 A | 5/2007 |
| JP | 2008-547232 A | 12/2008 |
| WO | 2005/086982 A2 | 9/2005 |
| WO | 2006/132254 A1 | 12/2006 |
| WO | 2007/012378 A1 | 2/2007 |
| WO | 2007-003255 A1 | 9/2011 |

OTHER PUBLICATIONS

Japanese Office Action, together with an English translation, issued Jan. 13, 2012.

* cited by examiner

CONDUCTIVE FILM REMOVAL AGENT AND CONDUCTIVE FILM REMOVAL METHOD

CROSS REFERENCE TO RELATED APPLICATIONS

This application is a U.S. National phase of International Application No. PCT/JP2010/055178, filed Mar. 25, 2010, which in turn claims priority to Japanese Patent Application No. 2009-81411, filed on Mar. 30, 2009 and Japanese Patent Application No. 2009-263510, filed on Nov. 19, 2009. The contents of each of which are incorporated herein by reference in their entirety.

TECHNICAL FIELD

The present invention relates to a conductive film removal agent and a conductive film removal method.

BACKGROUND ART

A transparent conductive film of tin-doped indium oxide (ITO) has been used widely for display panels such as liquid crystal displays, plasma displays, and electroluminescent (EL) displays, touch panels, and electronic devices such as solar cells. Conductive films including the transparent conductive film have been used by being formed into desired patterns. As a pattern formation method, a chemical etching method using a photoresist or an etching liquid has generally been used. However, there are problems that the number of steps is large, the etching precision may be lowered due to expansion of a resist in a solution, and handling of an etching liquid or waste solution treatment is problematic. As a method for solving the above-mentioned problems, known is a laser abrasion method of radiating near infrared region (NIR) laser light to the conductive film and thereby removing unnecessary parts. Although it is possible to carry out highly precise patterning with no need for a resist, usable base materials are limited, the cost is high, and the treatment speed is low and therefore, it is unsuitable for processing of a conductive film having a large surface area.

On the other hand, as a chemical etching method which does not require the resist step, there is proposed a method of applying a composition containing iron(III) chloride- or iron (III) chloride hexahydrate and a solvent to a region on a surface of an inorganic glass-like crystal to be etched and removing the composition by washing or burning (e.g., refer to Patent Document 2). Further, an etching medium containing phosphoric acid is also proposed (e.g., refer to Patent Document 3). Use of phosphoric acid makes control of the etching speed easy as compared with the case of iron(III) chloride. However, use of any one of these techniques has a problem that the etching does not proceed evenly in a plane and uneven etching occurs.

Furthermore, another method proposed is a method regarding a separation technique of a conductive film containing carbon nanotubes (CNTs) which includes immersing a substrate coated with CNTs in a separation solution, optionally mechanically or chemically stirring the substrate coated with CNTs, and washing the substrate coated with CNTs with a liquid for at least partially removing the CNTs (e.g., refer to Patent Document 4). However, this method is slow in the treatment speed and thus unsuitable for processing of a large surface area and has a problem that the etching does not proceed evenly in a plane and uneven etching occurs.

PRIOR ART DOCUMENTS

Patent Documents

Patent Document 1: Japanese Patent Application National Publication (Laid-Open) No. 2008-547232
Patent Document 2: Japanese Patent Application National Publication (Laid-Open) No. 2009-503825
Patent Document 3: International Publication No. 2005/086982

SUMMARY OF THE INVENTIONS

Problems to be Solved by the Invention

In view of the above-mentioned state of the art, the present invention aims to provide a conductive film removal agent and a conductive film removal method capable of removing a desired portion of a conductive film evenly in a plane.

Solutions to the Problems

The present invention provides a conductive film removal agent containing an acid having a boiling point of 80° C. or higher, or a base having a boiling point of 80° C. or higher, or a compound which generates an acid or a base by external energy in combination with a solvent, a resin, and a leveling agent. The present invention also provides a conductive film removal method including the steps of: applying the above-mentioned conductive film removal agent to at least a portion of a conductive film-bearing base material having a conductive film containing a whisker-like conductor, a fibrous conductor, or a granular conductor on the base material; carrying out heat treatment at 80° C. or higher; and removing the conductive film by washing using a liquid.

Advantages of the Invention

According to the present invention, a desired portion of a conductive film can be removed evenly in a plane.

EMBODIMENTS OF THE INVENTION

Figure 1:
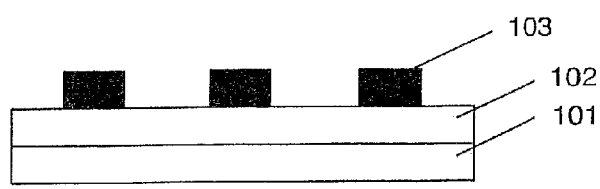
FIG. 1 A schematic drawing illustrating a state after a conductive film removal agent is applied to a conductive film-bearing base material (before heat treatment).

The conductive film removal agent of the present invention contains an acid having a boiling point of 80° C. or higher, or a base having a boiling point of 80° C. or higher, or a compound which generates an acid or a base by external energy in combination with a solvent, a resin, and a leveling agent. Due to incorporation of the leveling agent, the conductive film removal agent is provided with a high penetration ability and thus can easily remove a conductive film containing a whisker-like conductor, a fibrous conductor, or a granular conductor, which is conventionally difficult to be removed. The conductive film removal agent is applied to at least a portion of a conductive film-bearing base material having a conductive film containing a whisker-like conductor, a fibrous conductor, or a granular conductor, heat treatment is carried out at 80° C. or higher, and the conductive film is removed by washing using a liquid, so that the portion of the conductive film to which the conductive film removal agent is applied can be selectively removed. Application of the conductive film removal agent to a desired portion makes it possible to arbitrarily form a complicated and highly precise pattern including an acute angle and a curve. The heat treatment temperature is preferably a temperature lower than the boiling points of components of the conductive film removal agent other than the solvent and preferably 200° C. or lower.

The conductive film removal agent of the present invention contains an acid having a boiling point of 80° C. or higher, or a base having a boiling point of 80° C. or higher, or a compound which generates an acid or a base by external energy. The conductive film removal agent may contain two or more kinds of them. Since the conductive film removal agent contains an acid, or a base, or a compound which generates an acid or a base by external energy, at least a portion of a conductive film surface brought into contact with the conductive film removal agent can be decomposed, dissolved, or solubilized by heating. The conductive film removal agent of the present invention can easily remove even a conductive film containing CNTs or graphene with low reactivity as a conductor and a metal such as silver or copper. In the case the boiling point of the acid or the base is lower than 80° C., the acid or the base is evaporated at the heating temperature needed for reaction of the conductive film and the etching component, which results in difficulty of removal of the conductive film evenly in a plane.

The acid to be used in the present invention is not particularly limited as long as it has a boiling point of 80° C. or higher. In the present invention, the boiling point means a boiling point value under atmospheric pressure and is measured according to JIS-K5601-2-3 (1999), Name of Standard "Coating Component Test Method", Part 2: Component Analysis of Solvent-Soluble Substances, Section 3: Boiling Point Range". This standard standardizes a method of measuring a boiling point range of a liquid which is boiled at 30 to 300° C. under a normal pressure, which is chemically stable, and which does not corrode devices at the time of distillation. The boiling point is preferably 100° C. or higher and more preferably 200° C. or higher.

In the present invention, an acid which has no clear boiling point under atmospheric pressure and starts thermal decomposition at 80° C. or higher prior to evaporation when being heated is included in the "acid having a boiling point of 80° C. or higher". Further, the acid is preferably one having a vapor pressure density of 30 kPa or lower at the heat treatment temperature upon removing the conductive film. Examples thereof include monocarboxylic acids such as formic acid, acetic acid, and propionic acid; dicarboxylic acids such as oxalic acid, succinic acid, tartaric acid, and malonic acid; tricarboxylic acids such as citric acid and tricarballylic acid; alkylsulfonic acids such as methanesulfonic acid; phenylsulfonic acids such as benzenesulfonic acid; alkylbenzenesulfonic acids such as toluenesulfonic acid and dodecylbenzenesulfonic acid; sulfonic acid compounds such as phenolsulfonic acid; nitrobenzenesulfonic acid, styrenesulfonic acid, and polystyrenesulfonic acid; partially fluorinated derivatives of organic acids such as trifluoroacetic acid; and inorganic acids such as sulfuric acid, hydrochloric acid, nitric acid, and phosphoric acid. The conductive film removal agent may contain two or more kinds of them.

Among them, an acid having a high oxidizability is preferable and sulfuric acid or a sulfonic acid compound is more preferable. The boiling point of sulfuric acid under atmospheric pressure is 290° C. and the vapor pressure density of sulfuric acid at, for example, 150° C., is 1.3 kPa or lower, so that the liquid state can be maintained even after heating at this temperature and sulfuric acid can deeply penetrate into the conductive film. Further, due to its high oxidizability, sulfuric acid easily reacts on the conductive film even at a temperature as low as about 80 to 200° C. and can remove the conductive film without affecting the substrate by heat treatment within a shorter time than in the case of nitric acid or acetic acid. Further, since being a solid acid under atmospheric pressure, a sulfonic acid compound is not evaporated and the vapor, pressure density at, for example, 150° C., is 1.3 kPa or lower, so that the reaction can be efficiently promoted at the time of heating without causing evaporation or sublimation by heating at this temperature. Accordingly, the conductive film can be removed by the heat treatment within a short time. Further, the conductive film removal agent containing a solid acid makes control of non-Newtonian fluidity easy and is capable of highly precise pattern formation with suppressed variation (fluctuation) of line width of straight line patterns with a narrow line width of, for example, around 30 μm for various kinds of substrates and thus it is particularly preferable.

The base to be used for the present invention is not particularly limited as long as it has a boiling point of 80° C. or higher and the boiling point is preferably 100° C. or higher and more preferably 150° C. or higher. In addition, in the present invention, a base which has no clear boiling point under atmospheric pressure and starts thermal decomposition at 80° C. or higher prior to evaporation when being heated is included in the "base having a boiling point of 80° C. or higher". Further, the base is preferably one having a vapor pressure density of 30 kPa or lower at the heat treatment temperature upon removing the conductive film. Examples thereof include sodium hydroxide, potassium hydroxide, cesium hydroxide, tetramethylammonium hydroxide, barium hydroxide, guanidine, trimethylsulfonium hydroxide, sodium ethoxide, diazabicycloundecene, hydrazine, phosphazene, proazaphosphatrane, ethanolamine, ethylenediamine, triethylamine, trioctylamine, and amino-group-containing alkoxysilanes. The conductive film removal agent may contain two or more kinds of them.

Examples of a compound to be used for the present invention which generates an acid by external energy include compounds which generates an acid by radiation of radioactive beam or ultraviolet rays and/or heat. Examples thereof include sulfonium compounds such as 4-hydroxyphenyldimethylsulfonium hexafluoroantimonate and trifluoromethanesulfonate; benzophenone compounds such as 4,4-bis(dimethylamine)benzophenone and 4,4-dichlorobenzophenone; benzoin compounds such as benzoin methyl ether; phenyl ketone compounds such as 4-benzoyl-4-methyldiphenyl ketone and dibenzyl ketone; acetophenone compounds such as 2,2-diethoxyacetophenone and 2-hydroxy-2-methylpropiophenone; thioxanthene compounds such as 2,4-diethylthioxanthen-9-one and 2-chlorothioxanetone; anthraquinone compounds such as 2-aminoanthraquinone and 2-ethylanthraquinone; anthrone compounds such as benzanthrone and methyleneanthrone; imidazole compounds such as 2,2-bis(2-chlorophenyl)-4,4,5,5-tetraphenyl-1,2-biimidazole triazine compounds such as 2-(3,4-dimethoxystyryl)-4,6-bis(trichloromethyl)-1,3,5-tria zine and 2-[2-(5-methylfuran-2-yl)vinyl]-4,6-bis(trichloromethyl)-1,3,5-triazine; benzoyl compounds such as 2-benzoylbenzoic acid and benzoyl peroxide; sulfone compounds such as 2-pyridyltribromomethylsulfone and tribromomethylphenylsulfone; iodonium compounds such as 4-isopropyl-4-methyldiphenyliodonium tetrakis (pentafluorophenyl)borate and diphenyliodonium trifluoromethanesulfonate; tetramethylthiuram disulfide, 9-fluorenone, dibenzosuberone, N-methylacridone, nifedipine, camphorquinone, and carbon tetrabromide. The conductive film removal agent may contain two or more kinds of them.

Examples of a compound to be used for the present invention which generates a base by external energy include compounds which generates a base by radiation of radioactive beam or ultraviolet rays and/or heat. Examples thereof include amine compounds such as bis[($\alpha$-methyl)-2,4,6-trinitrobenzyloxycarbonyl]methanediph enylenediamine, and N-[(2-nitrophenyl)-1-methylmethoxy]carbonyl-2-propylamine; benzylcarbamate, benzylsulfoneamide, benzyl quaternary ammonium salts, imines, iminium salts, cobalt amine complexes, and oxime compounds. The conductive film removal agent may contain two or more kinds of them.

In the conductive film removal agent of the present invention, the content of the acid having a boiling point of 80° C. or higher, or the base having a boiling point of 80° C. or higher, or the compound which generates an acid or a base by external energy in the components excluding the solvent is preferably 1 to 80 wt.%. Especially, the content of the acid having a boiling point of 80° C. or higher in the components excluding the solvent is preferably 10 to 70 wt.% and more preferably 20 to 0.70 wt.%. The content of the base having a boiling point of 80° C. or higher in the components excluding the solvent is preferably 0.01 to 70 wt.%. Further, the content of the compound which generates an acid by external energy in the components excluding the solvent is preferably 0.1 to 70 wt.%. The content of the compound which generates the base by external energy in the components excluding the solvent is preferably 1 to 80 wt.%. Here, the contents are not limited to these ranges and properly selected in accordance with the molecular weights of the compounds, the amount of the acid or the base to be generated, the material of the conductive film to be removed and the film thickness, heating temperature, and heating time.

The conductive film removal agent of the present invention contains a solvent. Concrete examples of the solvent include acetic acid esters such as ethyl acetate and butyl acetate; ketones such as acetone, acetophenone, ethyl methyl ketone, and methyl isobutyl ketone; aromatic hydrocarbons such as toluene, xylene, and benzylalcohol; alcohols such as methanol, ethanol, 1,2-propanediol, terpineol, acetyl terpineol, butyl carbitol, ethyl cellosolve, ethylene glycol, triethylene glycol, tetraethylene glycol, and glycerol; ethylene glycol monoalkyl ethers such as triethylene glycol monobutyl ether; ethylene glycol dialkyl ethers, diethylene glycol monoalkyl ether acetates, ethylene glycol monoaryl ethers, polyethylene glycol monoaryl ethers, propylene glycol monoalkyl ethers, dipropylene glycol dialkyl ethers, propylene glycol monoalkyl ether acetates, ethylene carbonate, propylene carbonate, γ-butyrolactone, solvent naphtha, water, N-methylpyrrolidone, dimethyl sulfoxide, hexamethylphosphoric acid triamide, dimethylethyleneurea, N,N'-dimethylpropyleneurea, and tetramethylurea. The conductive film removal agent may contain two or more kinds of them.

In the present invention, the content of the solvent is preferably 1 wt.% or more, more preferably 30 wt.% or more, and even more preferably 50 wt.% or more in the conductive film removal agent. The fluidity of the conductive film removal agent can be improved and the coatability can be improved by adjusting the content of the solvent to be 1 wt.% or more. On the other hand, it is preferably 99.9 wt. % or less and more preferably 95 wt.% or less. The fluidity can be kept in a proper range at the time of heating and the desired pattern can be kept with high precision by adjusting the content of the solvent to be 99 wt.% or less.

The conductive film removal agent of the present invention contains a resin. Incorporation of the resin gives the conductive film removal agent having non-Newtonian fluidity and the conductive film removal agent can be easily applied to a substrate by a conventionally known method. Further, the fluidity of the conductive film removal agent is limited at the time of heat treatment and precision of the application position can be improved. Examples of the resin include polystyrene resins, polyacrylic resins, polyamide resins, polyimide resins, polymethacrylic resins, melamine resins, urethane resins, benzoguanamine resins, phenol resins, silicone resins, and fluororesins. The conductive film removal agent may contain two or more kinds of these resins. Among them, in the case a nonionic, anionic, amphoteric, or cationic hydrophilic resin is contained, the conductive film removal agent can be easily washed with water, an aqueous basic solution described later, and an aqueous solution of an organic solvent and the residue on the plane from which the conductive film has been removed can be suppressed and thus the evenness in a plane is further improved.

Concrete examples of the hydrophilic resin include compounds such as poly(vinyl pyrrolidone), hydrophilic polyurethane, polyvinyl alcohol, polyethyloxazoline, poly(acrylic acid), gelatin, hydroxyalkyl-gua, guar gum, locust bean gum, carrageenan, alginic acid, gum arabic, pectin, xanthan gum, cellulose, ethyl cellulose, hydroxypropyl cellulose, carboxymethyl cellulose, carboxymethyl hydroxyethyl cellulose sodium, acrylamide-based copolymers, polyethyleneimine, polyaminesulfonium, polyvinylpyridine, poly(dialkylaminoethyl methacrylate), poly(dialkylaminoethyl acrylate), poly(dialkylaminoethyl methacrylamide), poly(dialkylaminoethyl acrylamide), polyepoxyamine, polyamidoamine, a dicyanodiamide-formalin condensate, polydimethyldiallylammonium chloride, polyamine polyamidoepichlorohydrine, polyvinylamine, and polyacrylamine, and their modified products.

Among them, more preferable is a cationic resin which is hardly denatured even under an acid or high temperature condition and has high solubility in a polar solvent. Since the resin maintains the high solubility, the conductive film can be removed within a short time after heat treatment in a step of removing the conductive film by washing using a liquid. Here, the cationic resin is preferably a resin containing any one of primary to quaternary amino groups in a part of the structure thereof and examples thereof include compounds such as poly(dialkylaminoethyl methacrylate), poly(dialkylaminoethyl acrylate), poly(dialkylaminoethylmethacrylamide), poly(dialkylaminoethylacrylamide), polyepoxyamine, polyamidoamine, a dicyanodiamide-formalin condensate, polydimethyldiallylammonium chloride, guar hydroxypropyltrimonium chloride, polyamine polyamide epichlorohydrine, polyvinylamine, polyallylamine, polyacrylamine, Polyquaternium-4, Polyquaternium-6, Polyquaternium-7, Polyquaternium-9, Polyquaternium-10, Polyquaternium-11, Polyquaternium-16, Polyquaternium-28, Polyquaternium-32, Polyquaternium-37, Polyquaternium-39, Polyquaternium-51, Polyquaternium-52, Polyquaternium-44, Polyquaternium-46, Polyquaternium-55, and Polyquaternium-68, and their modified products. For example, Polyquaternium-10 has a trimethylammonium group in the terminal of a side chain. The trimethylammonium group is converted into a cation under an acidic condition and shows high solubility due to the action of electrostatic repelling force. Further, dehydration polycondensation by heating is hardly caused and high solvent-solubility is maintained even after heating. Therefore, after the heat treatment, the conductive film can be removed within a short time in the step of removing the conductive film by washing using a liquid.

In the conductive film removal agent of the present invention, the content of the resin in the components excluding the solvent is preferably 0.01 to 80 wt. %. In order to suppress the heating temperature needed for removal of the conductive film and shorten the heating time, the content of the resin in the conductive film removal agent is preferably as low as possible to the extent that the non-Newtonian fluidity can be maintained. The viscosity of the conductive film removal agent is preferably about 2 to 500 Pa·S (25° C.) and in that case, a uniform coating film can be easily formed by a screen printing method. The viscosity of the conductive film removal agent can be adjusted in accordance with, for example, the contents of the solvent and the resin.

The conductive film removal agent of the present invention contains a leveling agent. Incorporation of the leveling agent provides the conductive film removal agent with a high penetration ability and makes removal of even a conductive film containing a whisker-like conductor, a fibrous conductor, or a granular conductor easy. The leveling agent means a compound having a characteristic of lowering the surface tension to less than 50 mN/m when the surface tension is measured by a Wilhelmy method (plate method) for measuring stress of a static platinum plate in a wet state when the leveling agent is added in an amount of 0.1 wt. % to the above-mentioned solvent to be used in the present invention. Concrete examples thereof include acrylic compounds and acrylic resins such as modified polyacrylate; vinyl-based compounds and vinyl-based resins having double bonds in molecular skeletons; silicone-based compounds and silicone-based resins having alkyloxysilyl groups and/or polysiloxane skeletons; and fluorine-based compounds and fluorine-based resins having fluorinated alkyl groups and/or fluorinated phenyl groups. These compounds and resins may be properly selected for use in accordance with the material and the polarity state of the base material surface. Due to strong capability of decreasing the surface tension, fluorine-based compounds and fluorine-based resins having fluorinated alkyl groups and/or fluorinated phenyl groups are particularly preferably used. Concrete examples thereof include "MEGAFACE Surfactant (registered trade name)" F-114, F-410, F-443, F-444, F-445, F-470, F-471, F-472SF, F-474, F-475, R-30, F-477, F-478, F-479, F-480SF, F-482, F-483, F-489, F-493, F-494, F-555, BL-20, R-61, and R-90 (all manufactured by DIC Corporation), FC-170C, FC-4430, and FC-4432 (all manufactured by Sumitomo 3M Ltd.), "Asahi Guard (registered trade name)" AG-7000 and AG-7105 (all manufactured by Asahi Glass Co., Ltd.), and "FTERGENT (registered trade name)" 100, 150, 501, 250, 251, 300, 310, and 410SW (all manufactured by Neos Co., Ltd.) without any limitation. Additionally, in the present invention, even a polymer compound may be classified into the Leveling agent as long as the compound has the characteristic of lowering the surface tension of the above-mentioned solvent usable in the present invention to less than 50 mN/m.

In the conductive film removal agent of the present invention, the content of the leveling agent in the components excluding the solvent is preferably 0.001 to 10 wt. %, more preferably 0.01 to 5 wt. %, and even more preferably 0.05 to 3 wt. %, in terms of the balance between the surface activation capability such as wettability to the base material and the leveling property and the acid content in the coating film to be obtained.

In the present invention, in the case the acid having a boiling point of 80° C. or higher or the compound which generates an acid by external energy is contained, the conductive film removal agent preferably further contains a nitrate or a nitrite. The reaction of the acid and the conductor sometimes differs in the reaction speed according to the respective types and addition of a nitrate or a nitrite causes reaction of the acid with the nitrate or the nitrite at the time of heat treatment to produce nitric acid in the reaction system, so that dissolution of the conductor can be more promoted. Therefore, the conductive film can be removed by heat treatment within a short time. Examples of the nitrate include lithium nitrate, sodium nitrate, potassium nitrate, calcium nitrate, ammonium nitrate, magnesium nitrate, barium nitrate, tetrabutylammonium nitrate, tetraethylammonium nitrate, tetrabutylammonium nitrate, tetrabutylammonium nitrate, and hydrates of these nitrates. Examples of the nitrite include sodium nitrite, potassium nitrite, calcium nitrite, silver nitrite, and barium nitrite. The conductive film removal agent may contain two or more kinds of them. Among these compounds, in consideration of the reaction speed of nitric acid production, a nitrate is preferable and sodium nitrate or potassium nitrate is more preferable.

According to the purpose, the conductive film removal agent of the present invention may contain inorganic fine particles of titanium oxide, alumina, silica, or the like, a thixotropic agent for providing thixotropy, an antistatic agent, a defoaming agent, a viscosity adjustment agent, a light stabilizer, a weather-proofing agent, a heat resistant agent, an antioxidant, an antirust agent, a slipping agent, a wax, a releasing agent, a compatibility improver, a dispersant, a dispersion stabilizer, a rheology control agent, and the like.

Next, a production method of a conductive film removal agent of the present invention will be described by giving examples. First, a resin is added to a solvent and sufficiently stirred to dissolve therein. The stirring may be carried out under a heating condition and is preferably carried out at 50 to 80° C. for the purpose of increasing the dissolution speed. Next, an acid having a boiling point of 80° C. or higher, or a base having a boiling point of 80° C. or higher, or a compound which generates an acid or a base by external energy as well as a leveling agent and if necessary, the above-mentioned additives are added and stirred. The addition method and addition order are not particularly limited. The stirring may be carried out under a heating condition and is preferably carried out at 50 to 80° C. for the purpose of increasing the dissolution speed of the additive.

Figure 2:
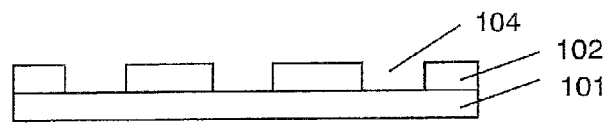
FIG. 2 A schematic drawing illustrating a state after a conductive film is removed by the conductive film removal method of the present invention.

Next, a conductive film removal method of the present invention will be described with reference to the drawings. FIG. 1 is a schematic drawing illustrating a state after a conductive film removal agent is applied to a conductive film-bearing base material (before heat treatment). FIG. 2 is a schematic drawing illustrating a state after a conductive film is removed by the conductive film removal method of the present invention.

The method includes the steps of applying the above-mentioned conductive film removal agent 103 to at least a portion of a conductive film bearing base material having a conductive film 102 containing a whisker-like conductor, fibrous conductor, or a granular conductor on the base material 101; carrying out heat treatment 80° C. or higher; and removing the conductive film by washing using a liquid. In FIG. 2, the reference number 104 shows a portion from which the conductive film has been removed. Since the conductive film removal agent is directly applied to the base material and subjected to the heat treatment, the conductive film removal agent reaches the lower layer of the conductive film within a short time and the reaction proceeds quickly. Since having a high penetration ability to the conductive film, the conductive film removal agent of the present invention is particularly excellent in the removal effect on not only an oxide transparent conductive film but also a conductive film containing a whisker-like conductor, a fibrous conductor, or a granular conductor, which is conventionally difficult to be removed.

The conductive film base material from which the conductive film is to be removed by the conductive film removal method of the present invention has a conductive film containing a whisker-like conductor, a fibrous conductor, or a granular conductor on a base material. The conductive film may contain two or more kinds of these conductors.

The base material may be of, for example, thermoplastic resins such as polyethylene, polystyrene, poly(methyl methacrylate), and poly(vinyl chloride); polyester resins such as polyethylene terephthalate) and poly(ethylene 2,6-naphthalate); poly(p-phenylene sulfite), polyamide resins, polyimide resins, acrylic resins, urethane resins, alkyd resins, phenol resins, epoxy resins, silicone resins, polycarbonate resins, ABS resins, various kinds of glass, and quartz. Those containing inorganic fillers such as silica and glass, or fine particles such as acrylic beads are also usable. The base material may be surface-treated by various kinds of plasma treatments, UV-ozone treatment, and the like to further improve the coatability and penetration ability. The shape of the base material may be any shape such as a disk-like, card-like, or sheet-like shape.

The above-mentioned whisker-like conductor is a metal or a compound having an aspect ratio (L/D) of 3 or more, such as a carbon-based compound or a metal oxide. Examples of the metal include elements of Group IIA Group IIIA, Group IVA, Group VA, Group VIA, Group VILA, Group VIII, Group IB, Group IIB, Group IIIB, Group IVB, and Group VB in the short-cycle type periodic table of elements. Concrete examples thereof include gold, platinum, silver, nickel, stainless steel, copper, brass, aluminum, gallium, zirconium, hafnium, vanadium, niobium, tantalum, chromium, molybdenum, manganese, antimony, palladium, bismuth, technetium, rhenium, iron, osmium, cobalt, zinc, scandium, boron, indium, silicon, germanium, tellurium, tin, magnesium, and alloys containing these elements. Examples of the carbon-based compound include carbon nanohorn, fullerene, and graphene; Examples of the metal oxide include $InO_2$, $InO_2Sn$, $SnO_2$, $ZnO$, $SnO_2$—$Sb_2O_4$, $SnO_2$—$V_2O_5$, $TiO_2(Sn/Sb)O_2$, $SiO_2(Sn/Sb)O_2$, $K_2O$-$nTiO_2$—$(Sn/Sb)O$, and $K_2O$-$nTiO_2$—C.

Examples of the fibrous conductor include carbon-based fibers, conductive polymers, metal-based fibers, and metal oxide-based fibers. The fiber diameter is preferably 0.001 to 1 μm and the fiber length is preferably 0.01 to 100 μm. Examples of the carbon-based fibers include polyacrylonitrile-based carbon fibers, pitch-based carbon fibers, rayon-based carbon fibers, glassy carbon, CNTs, carbon nano-coils, carbon nano-wires, carbon nano-fibers, carbon whiskers, and graphite fibrils. Here, CNTs may be of a monolayer or multilayer type and two or more kinds of CNTs different in the number of layers may be used. CNTs preferably have a diameter of 0.3 to 100 nm and a length of 0.1 to 20 μm. Examples of the conductive polymer include polythiophene, polyaniline, and poly(2-ethylhexyloxy-5-methoxy-1,4-phenylvinylene). Examples of the metal-based fibers include fibrous metals and fibrous metal alloys produced from gold, platinum, silver, nickel, silicon, stainless steel, copper, brass, aluminum, zirconium, hafnium, vanadium, niobium, tantalum, chromium, molybdenum, manganese, technetium, rhenium, iron, osmium, cobalt, zinc, scandium, boron, gallium, indium, silicon, germanium, tin, magnesium, and the like. Examples of the metal oxide-based fibers include fibrous metal oxides and fibrous metal oxide composites produced from $InO_2$, $InO_2Sn$, $SnO_2$, $ZnO$, $SnO_2$—$Sb_2O_4$, $SnO_2$—$V_2O_5$, $TiO_2(Sn/Sb)O_2$, $SiO_2(Sn/Sb)O_2$, $K_2O$-$nTiO_2$—$(Sn/Sb)O_2$, $K_2O$-$nTiO_2$—C, and the like. They may be surface-treated. Further, those obtained by coating the surfaces of non-metallic materials such as plant fibers, synthetic fibers, or inorganic fibers with the above-mentioned metals, metal oxides, or CNTs; or by vapor-depositing the above-mentioned metals, metal oxides, or CNTs onto the surfaces of non-metallic materials are also included in the fibrous Conductor. The fibrous conductor is evenly dispersed on the base material without being agglomerated.

The granular conductor is preferably particles of a metal, a metal oxide, a metal nitride, a conductive polymer, or the like and having an aspect ratio (L/D) smaller than 3 and an average particle diameter of 100 nm or smaller. Examples of the metal include those exemplified as the metal composing the fibrous conductor. Examples of the metal oxide include indium oxide and compounds obtained by doping indium, oxide with at least one kind of element selected from the group consisting of tin, zinc, tellurium, silver, zirconium, hafnium, and magnesium; tin oxide and compounds obtained by doping tin oxide with antimony, zinc, or fluorine; and zinc oxide and compounds obtained by doping zinc oxide with an element such as aluminum, gallium, indium, boron, fluorine, or manganese. Examples of the metal nitride include gallium nitride, titanium nitride, chromium nitride, copper nitride, aluminum nitride, indium nitride, tin nitride, zirconium nitride, magnesium nitride, and nitride compounds obtained by doping these nitrides with lithium, germanium, manganese, silicon, magnesium, or the like. Examples of the conductive polymer include those exemplified as the conductive polymers composing the fibrous conductor.

In the present invention, the conductive film preferably contains CNTs or metal-based fibers among the above-mentioned conductors and more preferably contains CNTs Even in CNTs with low reactivity, the surface defects of CNTs and functional groups introduced into the CNT surfaces by chemical modification tend to serve as starting points of the reaction by application of the conductive film removal agent of the present invention and heat treatment and, accordingly, decomposition, dissolution, and solubilization are more easily caused and the processability can be improved.

In the present invention, the conductive film-bearing base material may have an overcoat layer on the conductive film. A material for forming the overcoat layer may be an organic or inorganic polymer material, an organic-inorganic hybrid resin, or the like. Examples of the organic polymer material include thermoplastic resins, thermosetting resins, cellulose resins, and photo-setting resins, and may be selected properly in terms of the visible light transmittance, heat resistance and the glass transition point of the base material, and the film hardness. Examples of the thermoplastic resins include acrylic resins such as poly(methyl methacrylate) and polystyrene; polyester resins such as polyethylene terephthalate), polycarbonates, and poly(lactic acid); ABS resins, polyethylene, polypropylene, and polystyrene. Examples of the thermosetting resins include phenol resins, melamine resins, alkyd resins, polyimides, epoxy resins, fluororesins, and urethane resins. Examples of the cellulose resins include acetylcellulose and triacetylcellulose. Examples of the photo-setting resins include resins containing various kinds of oligomers, monomers, and photopolymerization initiators without any particular limitation. Examples of the inorganic material include silica sol, alumina sol, zirconia sol, titania sol, polymers obtained by hydrolyzing these inorganic materials after addition of water and an acid catalyst and carrying out dehydration condensation, and polymers obtained by further hydrolyzing commercialized solutions containing tetramers to pentamers by previous polymerization and carrying out dehydration condensation. Examples of the organic-inorganic hybrid resin include those obtained by partially modifying the above-mentioned inorganic materials with organic functional groups or resins containing various kinds of coupling agents such as silane coupling agents as main components.

The conductive film removal agent is applied to a portion of the conductive film-bearing base material. The conductive film removal agent is applied to a portion of the conductive film-bearing base material which is to be removed. In the case the conductive-film-bearing base material has an overcoat layer, the conductive film removal agent is applied to a portion of the overcoat layer which is to be removed. Since the conductive film removal agent of the present invention has non-Newtonian fluidity, the conductive film removal agent can be applied to a base material by a conventionally known method, regardless of the type, size, and shape of the base material. A coating method is not particularly limited and may be, for example, a screen printing method, a dispenser method, a stencil printing method, a pad printing method, spray coating, an ink jet method, a micro-gravure printing method, a knife coating method, a spin coating method, a slit coating method, a roll coating method, a curtain coating method, a flow coating method, or the like. Further, to lessen the etching unevenness of the conductive film, it is preferable to evenly apply the conductive film removal agent to the base material.

The thickness of the conductive film removal agent may be determined properly in accordance with the material and thickness of the conductive film to be removed, heating temperature, and heating time. The conductive film removal agent is applied so that the thickness after drying is preferably 0.1 to 200 μm and more preferably 2 to 200 μm. Necessary amounts of conductive film removal components can be contained in the coating film and the conductive film can be removed more evenly in a plane by controlling the thickness after drying within the above-mentioned range. Further, dripping in the transverse direction at the time of heating can be suppressed, so that a desired pattern can be obtained without positional shift of a coating film boundary line.

Next, the conductive film-bearing base material to which the conductive film removal agent is applied is heated at 80° C. or higher. The heat treatment temperature is preferably a temperature lower than the boiling points of the components of the conductive film removal agent other than the solvent and preferably 200° C. or lower. A portion of the conductive film to which the conductive film removal agent is applied is decomposed, dissolved, or solubilized by heat treatment in the above-mentioned temperature range. In the case the conductive film-bearing base material has an overcoat layer, the overcoat layer and the conductive film are decomposed, dissolved, or solubilized. A heat treatment method may be selected in accordance with the purpose and use and examples thereof include methods using a hot plate, a hot air oven, and an infrared oven, and radiation of microwave with a frequency of 300 MHz to 3 THz without any particularly limitation.

After heat treatment, the conductive film removal agent and decomposed and dissolved products of the conductive film are removed by washing with a liquid to obtain a desired conductive pattern. The liquid to be used in the washing step is preferably one in which the resin contained in the conductive film removal agent can be dissolved and concrete examples thereof include organic solvents such as acetone, methanol, and tetrahydrofuran; aqueous solutions containing the organic solvents; basic aqueous solutions containing sodium hydroxide, ethanolamine, triethylamine, and the like; and pure water without any particular limitation. In the washing step, in order to carry out the washing without residues on the base material, the liquid may be used after being heated to 25 to 100° C.

In the case the conductive film removal method of the present invention is applied to the conductive film-bearing base material, the reaction products of the compounds and/or the acid contained in the conductive film removal agent of the present invention with the conductor may be partially adsorbed and remain on at least a portion of the conductive film-removed face. Concrete examples thereof include compounds contained in the conductive film removal agent of the present invention, metal salts such as silver chloride, silver sulfate, nickel nitrate, copper sulfate, copper nitrate, tin sulfate, tin nitrate, and indium sulfate; metal sulfonic acid compounds such as silver p-toluenesulfonate, nickel benzenesulfonate, and tin phenolsulfonate; and a fluorine compound of the above-mentioned leveling agent. Particularly, since the conductive film removal agent and the conductive film are reacted on each other in a viscous reaction field, the removal agent and the reaction products tend to remain on the base material even after washing of the base material, so that the method can be distinguished in some cases from a method of using a conventionally known etchant by analyzing the residues.

Further, with respect to residues on the base material surface, since no resist is used in the conductive film removal method of the present invention, no resist-relevant component is detected; whereas, in a conventionally known method of using an etchant, a resist is generally used and therefore, any of the resist, a resist developer solution, and a resist removal agent or a plurality of components are detected on the base material surface. Accordingly, the present invention and the conventionally known method can be distinguished from each other in some cases.

The components remaining on the base material surface can be measured by a method such as an X-ray photoelectron spectrometry, X-ray fluorescence analysis, or time-of-flight secondary ion mass spectrometry. The X-ray photoelectron spectrometry can detect 0.1 atomic % or more of a metal element such as silver, copper, tin, indium, or nickel used in the conducive layer and/or a fluorine or sulfur element and use of the X-ray fluorescence analysis or time-of-flight secondary ion mass spectrometry enables detection of 1 ppm or more of the above-mentioned elements.

When the conductive film removal agent of the present invention is applied in a straight line-like shape by, for example, screen printing, the cross section of the applied line may have a projected shape and the cross section of the base material after the conductive film removal may have a semi-circularly recessed shape. As described above, the removal effect of the present invention is sometimes in proportional to the application thickness and the removal degree in the circumference of the conductive film removal part may sometimes be intermediate. However, since the removal agent does not move from the applied position, even if the application amount is more or less fluctuated, or the heat treatment temperature or time is more or less changed, basically the desired portion can be removed with high precision and evenly in a plane. On the other hand, in the case of a conventionally known method of using an etchant, any intermediate part in the circumference of the conductive film-removed part is scarcely observed; however, accurate control of the etching rate is difficult, so that insufficient etching, overetching, or side etching, that is, erosion to the lower face of the resist tends to be caused due to slight fluctuation of the etching condition and the size precision tends to become uneven. Due to such a tendency, the method of the present invention and a conventionally known method can be distinguished from each other in some cases.

EXAMPLES

Hereinafter, a conductive film removal agent and a conductive film removal method of the present invention will be concretely described with reference to examples. However, the present invention should not be limited to the following examples.

(1) Method for Appearance Evaluation Conductive Film-Removed Face

Each conductive film removal agent was applied in a frame-like pattern with an outer frame of 10 cm×10 cm and an inner frame of 9×9 cm and a line width of 1 cm on each conductive film-bearing base material described in respective examples and comparative examples by a screen printing method using a SUS #200 mesh so as to give a thickness after drying shown in Tables 1 to 3 and thereafter, each base material was put in an infrared oven and heated under the conditions shown in Tables 1 to 3. After the heat treatment, each base material was taken out of the oven and left standing to cool to room temperature and thereafter, the conductive film removal agent and the decomposition products adhering to the base material were removed by washing under conditions described in the respective examples and comparative examples. Each substrate was drained in compressed air and dried at 80° C. for 1 minute in an infrared oven to obtain a patterned conductive film-bearing base material. The patterned conductive film-bearing base material was observed with an optical microscope (ECLIPSE-L200, manufactured by Nikon Corporation, magnification: 500 times) to evaluate the existence of spot-like and/or dot-like residues with an outer circumference of 0.01 mm or larger in the inside of the outer frame of 10 cm×10 cm.

(2) Evaluation Method of Conductive Film Removal Line Width

Each conductive film removal agent was applied to each conductive film-bearing base material described in respective Examples 26 to 38 and Comparative Example 5 by a screen printing method using a SUS #500 mesh so as to give a thickness after drying shown in Table 3. The printing pattern was respective straight lines with a line length of 5 cm and a line width of 30 μm, 50 μm, 100 μm, or 500 μm. After application of the conductive film removal agent, the heat treatment was carried out under the conditions shown in Table 3 and each base material was taken out of the oven and left standing to cool to room temperature and thereafter, the conductive film removal agent and the decomposition products adhering to the substrate were removed by washing with pure water of 25° C. for 1 minute. The substrate was drained in compressed air and dried at 80° C. for 1 minute in an infrared oven to obtain a patterned conductive film-bearing base material. Next, the portions of 1 cm from both end parts of the etching line were cut and a base material bearing a conductive film of 3 cm×10 cm defined by the etching line was obtained. Probes of an insulation resistance meter (EA709DA-1 manufactured by SANWA ELECTRIC INSTRUMENT Co., Ltd) were attached to the right and left sides of the etching line and the minimum line width of: the pattern which showed a resistance of 10 MΩ or more by 25 V d.c. application was defined as the conductive film removal line width. In the case the conductive film removal line width was 500 μm or less, it can be said that a highly precise pattern can be formed.

(3) Evaluation Method of Line Straightness (Undulation) Of Etching Boundary Part The frame-like conductive film removal line formed by the method described in (1) was observed with an optical microscope (ECLIPSE-L200, manufactured by Nikon Corporation, magnification: 500 times). The line width of the removal line was measured at every 100 mm interval and the standard deviation (σ) was calculated from the results of 20 points in total. In the case the standard deviation was 5 or less, it can be said that a highly precise pattern can be formed.

Example 1

In a container, 100 g of N-methylpyrrolidone and 10 g of pure water were put and mixed, and 2 g of Polyquaternium-10 (C-60 H, manufactured by Kao Corporation) was added thereto and the resultant was stirred for 30 minutes while being heated to 60° C. in an oil bath. Next, the container was taken out of the oil bath and left standing to cool to room temperature and thereafter, 0.1 g of a leveling agent (a fluorine-based surfactant F-477, manufactured by DIC Corporation) and 4 g of sulfuric acid (manufactured by Wako Pure Chemical Industries, Ltd., concentration 98%, boiling point under atmospheric pressure: 290° C.) were added and stirred for 15 minutes. The obtained solution was filtered by a membrane filter (manufactured by Millipore, Omnipore Membrane PTFE, nominal diameter 0.45 μm) to obtain a conductive film removal agent. Next, to a conductive film-bearing base material (88% permeability at 550 nm and 860 Ω/square surface resistance) obtained by forming a thin film of double-wall carbon nanotubes (DWCNTs), a fibrous conductor, on a PET film with a size of 21×15 cm and a thickness of 188 μm was applied the obtained conductive film removal agent in the frame-like pattern as described in (1) by a screen printing method using a SUS #200 mesh and the conductive film was patterned by the above-mentioned method (1) to obtain a patterned conductive film-bearing base material. Washing was carried out with pure water of 25° C. for 1 minute. When the appearance of the conductive film-removed face was evaluated, no residue was observed and the appearance was good. When 25 V d.c. was applied to the conductive film-removed part by using an insulation resistance meter (EA 709DA-1, manufactured by SANWA ELECTRIC INSTRUMENT Co., Ltd) and measurement was carried out at every 1 cm interval, the insulation resistance was 40 MΩ or higher.

Example 2

A patterned conductive film-bearing base material was obtained by the same operations Example 1, except that the amount of sulfuric acid to be added to the conductive film removal agent was changed to 1 g and the heat treatment conditions by an infrared oven were changed to 150° C. for 5 minutes. When the appearance of the conductive film-removed face was evaluated in the same manner as in Example 1, no residue was observed and the appearance was good. When the insulation resistance of the conductive film-removed part was measured in the same manner as in Example 1, the insulation resistance was 40 MΩ or higher.

Example 3

A patterned conductive film-bearing base material was obtained by the same operation as in Example 1, except that the amount of sulfuric acid to be added to the conductive film removal agent was changed to 0.5 g and the heat treatment conditions by an infrared oven were changed to 130° C. for 30 minutes. When the appearance of the conductive film-removed face was evaluated in the same manner as in Example 1, no residue was observed and the appearance was good. When the insulation resistance of the conductive film-removed part was measured in the same manner as in Example 1, the insulation resistance was 40 MΩ or higher.

Example 4

A patterned conductive film-bearing base material was obtained by the same operation as in Example 1, except that the heat treatment condition by an infrared oven were changed to 80° C. for 60 minutes. When the appearance of the conductive film-removed face was evaluated in the same manner as in Example 1, no residue was observed and the appearance was good. When the insulation resistance of the conductive film-removed part was measured in the same manner as in Example 1, the insulation resistance was 40 MΩ or higher.

Example 5

A patterned conductive film-bearing base material was obtained by the same operation as in Example 1, except that the resin to be added to the conductive film removal agent was changed to a carboxymethyl cellulose (manufactured by Tokyo Chemical Industry Co., Ltd., weight average molecular weight 230000), the washing liquid was changed to pure water heated at 80° C. and the washing time was changed to 10 minutes. When the appearance of the conductive film-removed face was evaluated in the same manner as in Example 1, no residue was observed and the appearance was good. When the insulation resistance of the conductive film-removed part was measured in the same manner as in Example 1, the insulation resistance was 40 MΩ or higher.

Example 6

A patterned conductive film-bearing base material was obtained by the same operation as in Example 1, except that the resin to be added to the conductive film removal agent was changed to polyvinylpyrrolidone (manufactured by Tokyo Chemical Industry Co., Ltd., weight average molecular weight 4000), the washing liquid was changed to pure water heated at 80° C. and the washing time was changed to 10 minutes. When the appearance of the conductive film-removed face was evaluated in the same manner as in Example 1, no residue was observed and the appearance was good. When the insulation resistance of the conductive film-removed part was measured in the same manner as in Example 1, the insulation resistance was 40 MΩ or higher.

Example 7

A patterned conductive film-bearing base material was obtained by the same operation as in Example 1, except that the acid to be added to the conductive film removal agent was changed to nitric acid (boiling point under atmospheric pressure: 82.6° C.) and the heat treatment conditions by an infrared oven were changed to 80° C. for 15 minutes. When the appearance of the conductive film-removed face was evaluated in the same manner as in Example 1, 10 or more residues with an outer circumference of 0.1 mm or more were observed. When the insulation resistance of the conductive film-removed part was measured in the same manner as in Example 1, the insulation resistance was 40 MΩ or higher.

Example 8

A patterned conductive film-bearing base material was obtained by the same operation as in Example 1, except that the acid to be added to the conductive film removal agent was changed to acetic acid (boiling point under atmospheric pressure: 118° C.) and the heat treatment conditions by an infrared oven were changed to 100° C. for 15 minutes. When the appearance of the conductive film-removed face was evaluated in the same manner as in Example 1, 10 or more residues with an outer circumference of 0.1 mm or more were observed. When the insulation resistance of the conductive film-removed part was measured in the same manner as in Example 1, the insulation resistance was 40 MΩ or higher.

Example 9

A patterned conductive film-bearing base material was obtained by the same operation as in Example 7, except that the heat treatment conditions by an infrared oven were changed to 80° C. for 60 minutes. When the appearance of the conductive film-removed face was evaluated in the same manner as in Example 1, 10 or more residues with an outer circumference of 0.1 mm or more were observed. When the insulation resistance of the conductive film-removed part was measured in the same Manner as in Example 1, the insulation resistance was −40 MΩ or higher.

Example 10

A patterned conductive film-bearing base material was obtained by the same operation as in Example 8, except that the heat treatment conditions by an infrared oven were changed to 80° C. for 60 minutes. When the appearance of the conductive film-removed face was evaluated in the same manner as in Example 1, 10 or more residues with an outer circumference of 0.1 mm or more were observed. When the insulation resistance of the conductive film-removed part was measured in the same manner as in Example 1, the insulation resistance was 40 MΩ or higher.

Example 11

A patterned conductive film-bearing base material was obtained by the same operation as in Example 1, except that the conductive film-bearing base material was changed to a glass substrate with a thickness of 0.7 mm. When the appearance of the conductive film-removed face was evaluated in the same manner as in Example 1, no residue was observed and the appearance was good. When the insulation resistance of the conductive film-removed part was measured in the same manner as in Example 1, the insulation resistance was 40 MΩ or higher.

Example 12

A patterned conductive film-bearing base material was obtained by the same operation as in Example 1, except that the conductive film-bearing base material was changed to a polycarbonate base material with a thickness of 1 mm. When the appearance of the conductive film-removed face was evaluated in the same manner as in Example 1, no residue was observed and the appearance was good. When the insulation resistance of the conductive film-removed part was measured in the same manner as in Example 1, the insulation resistance was 40 MΩ or higher.

Example 13

A patterned conductive film-bearing base material was obtained by the same operation as in Example 1, except that 100 g of N-methylpyrrolidone was added to the conductive film removal agent for dilution, the screen plate was changed to a pet #300 mesh, the thickness after drying of the conductive film removal agent was adjusted to be 0.1 µm, and the heat treatment conditions by an infrared oven were changed to 130° C. for 30 minutes. When the appearance of the conductive film-removed face was evaluated in the same manner as in Example 1, 10 to 20 residues with an outer circumference of 0.05 mm or more were observed. When the insulation resistance of the conductive film-removed part was measured in the same manner as in Example 1, the insulation resistance was 40 MΩ or higher.

Example 14

A patterned conductive film-bearing base material was obtained by the same operation as in Example 1, except that the thickness after drying was adjusted to be 200 µm by printing the conductive film removal agent a plurality of times. When the appearance of the conductive film-removed face was evaluated in the same manner as in Example 1, no residue was observed and the appearance was good. When the insulation resistance of the conductive film-removed part was measured in the same manner as in Example 1, the insulation resistance Was 40 MΩ or higher.

Example 15

A patterned conductive film-bearing base material was obtained by the same operation as in Example 1, except that the acid to be added to the conductive film removal agent was changed to basic 2-ethanolamine and the heat treatment conditions by an infrared oven were changed to 130° C. for 30 minutes. When the appearance of the conductive film-removed face was evaluated in the same manner as in Example 1, 10 to 20 residues with an outer circumference of 0.05 mm or more were observed. When the insulation resistance of the conductive film-removed part was measured in the same manner as in Example 1, the insulation resistance was 40 MΩ or higher.

Example 16

A patterned conductive film-bearing base material was obtained by the same operation as in Example 1, except that the acid to be added to the conductive film removal agent was changed to a thermal acid generator 1 ("San-Aid (registered trade name)" SI-110, manufactured by SANSHIN CHEMICAL INDUSTRY Co., Ltd.) and the heat treatment conditions by an infrared oven were changed to 130° C. for 30 minutes. When the appearance of the conductive film-removed face was evaluated in the same manner as in Example 1, 1 to 10 residues with an outer circumference of 0.05 mm or more were observed. When the insulation resistance of the conductive film-removed part was measured in the same manner as in Example 1, the insulation resistance was 40 MΩ or higher.

Example 17

A patterned conductive film-bearing base material was obtained by the same operation as in Example 1, except that the acid to be added to the conductive film removal agent was changed to a thermal acid generator 2 (ADEKA OPTOMER CP series, manufactured by ADEKA) and the heat treatment conditions by an infrared oven were changed to 130° C. for 30 minutes. When the appearance of the conductive film removed face was evaluated in the same manner as in Example 1, 1 to 10 residues with an outer circumference of 0.01 mm or more were observed. When the insulation resistance of the conductive film-removed-part was measured in the same manlier as in Example 1, the insulation resistance was 40 MΩ or higher.

Example 18

A patterned conductive film-bearing base material was obtained by the same operation as in Example 1, except that the acid to be added to the conductive film removal agent was changed to a thermal base generator 1 (U-CAT SA1, manufactured by SAN-APRO LIMITED Ltd) and the heat treatment conditions by an infrared oven were changed to 130° C. for 30 minutes. When the appearance of the conductive film-removed face was evaluated in the same manner as in Example 1, 10 to 20 residues with an outer circumference of 0.01 mm or more were observed. When the insulation resistance of the conductive film-removed part was measured in the same manner as in Example 1, the insulation resistance was 40 MΩ or higher.

Example 19

A patterned conductive film-bearing base material was obtained by the same operation as in Example 1, except that the conductive film of the conductive film-bearing base material was changed to a film obtained by vacuum vapor deposition of antimony-doped tin oxide and heat treatment conditions by an infrared oven were changed to 130° C. for 30 minutes. When the appearance of the conductive film-removed face was evaluated in the same manner as in Example 1, 10 to 20 residues with an outer circumference of 0.1 to 0.3 mm were observed. When the insulation resistance of the conductive film-removed part was measured in the same manner as in Example 1, the insulation resistance was 40 MΩ or higher.

Example 20

A patterned conductive film-bearing base material was obtained by the same operation as in Example 1, except that the conductive film of the conductive film-bearing base material was changed to a film of copper formed by an electrolytic plating method and heat treatment conditions by an infrared oven were changed to 130° C. for 30 minutes. When the appearance of the conductive film-removed face was evaluated in the same manner as in Example 1, 10 to 20 residues with an outer circumference of 0.01 mm or more were observed. When the insulation resistance of the conductive film-removed part was measured in the same manner as in Example 1, the insulation resistance was 40 MΩ or higher.

Example 21

A patterned conductive film-bearing base material was obtained by the same operation as in Example 1, except that CNTs of the conductive film of the conductive film-bearing base material were changed to water dispersion of whisker like antimony-doped tin oxide (needle-like transparent conductive material FS-10D, L/D=20 to 30, manufactured by Ishihara Sangyo Kaisha, Ltd.) and heat treatment conditions by an Infrared oven were changed to 130° C. for 30 minutes. When the appearance of the conductive film-removed face was evaluated in the same manner as in Example 1, no residue was observed and the appearance was good. When the insulation resistance of the conductive film-removed part was measured in the same manner as in Example 1, the insulation resistance was 40 MΩ or higher.

Example 22

A patterned conductive film-bearing base material was obtained by the same operation as in Example 1, except that a conductive film-bearing base material using granular ITO for the conductive film ("FLECLEAR (registered trade name) ", L/D=0.8 to 1.3, manufactured by TDK Co., Ltd.) was used and the heat treatment conditions by an infrared oven were changed to 130° C. for 30 minutes. When the appearance of the conductive film-removed face was evaluated in the same manner as in Example 1, no residue was observed and the appearance was good. When the insulation resistance of the conductive film-removed part was measured in the same manner as in Example 1, the insulation resistance was 40 MΩ or higher.

Example 23

A patterned conductive film-bearing base material was obtained by the same operation as in Example 1, except that a conductive film-bearing base material having an overcoat layer with a thickness of 100 nm (N-butyl silicate, manufactured by Colcoat Co., Ltd.) on the conductive film was used. When the appearance of the conductive film-removed face was evaluated in the same manner as in Example 1, no residue was observed and the appearance was good. When the insulation resistance of the conductive film-removed part was measured in the same manner as in Example 1, the insulation resistance was 40 MΩ or higher.

Example 24

A patterned conductive film-bearing base material was obtained by the same operation as in Example 1, except that the resin to be added to the conductive film removal agent was changed to polyallylamine (manufactured by Nitto Boseki Co., Ltd., weight average molecular weight 20000). When the appearance of the conductive film-removed face was evaluated in the same manner as in Example 1, no residue Was observed and the appearance was good. When the insulation resistance of the conductive film-removed part was measured in the same manner as in Example 1, the insulation resistance was 40 MΩ or higher.

Example 25

A patterned conductive film-bearing base material was obtained by the same operation as in Example 1, except that the resin to be added to the conductive film removal agent was changed to guar-hydroxypropyltrimonium chloride (manufactured Toho Chemical Industry Co., Ltd., weight average molecular weight 200000) and the leveling agent was changed to a fluorine-based monomer ("FTERGENT (registered trade name)" 750 FL, manufactured by, Neos Co., Ltd.). When the appearance of the conductive film-removed face was evaluated in the same manner as in Example 1, no residue was observed and the appearance was good. When the insulation resistance of the conductive film-removed part was measured in the same manner as in Example 1, the insulation resistance was 40 MΩ or higher.

Comparative Example 1

The same operation as in Example 1 was carried out, except that no resin was added to the conductive film removal agent. However, the conductive film removal agent was not fixed on the conductive film and a portion of the agent was repelled and moved, so that the pattern shape could not be maintained. When the appearance of the conductive film-removed face was evaluated in the same manner as in Example 1, 10 or more residues with an outer circumference of 1.5 mm or more were observed. When the insulation resistance of the conductive film-removed part was measured in the same manner as in Example 1, the insulation resistance was 1200Ω.

Comparative Example 2

The same operation as in Example 1 was carried out, except that no leveling agent was added to the conductive film removal agent. However, a portion of the conductive film removal agent was repelled and moved, so that the pattern shape could not be maintained. When the appearance of the conductive film-removed face was evaluated in the same manner as in Example 1, 20 or more residues with an outer circumference of 2 mm or more were observed. When the insulation resistance of the conductive film-removed part was measured in the same manner as in Example 1, the insulation resistance was 40 MΩ or higher.

Comparative Example 3

A patterned conductive film-bearing base material was obtained in the same manner as in Example 1, except that neither a resin nor a leveling agent was added to the conductive film removal agent and in place of the acid, a base, dimethylacetamide (manufactured by Tokyo Chemical Industry Co., Ltd., boiling point under atmospheric pressure: 165° C.) was used and the heat treatment conditions by an infrared oven were changed to 130° C. for 30 minutes. When the appearance of the conductive film-removed face was evaluated in the same manner as in Example 1, 10 or more residues with an outer circumference of 1 mm or more were observed. When the insulation resistance of the conductive film-removed part was measured in the same manner as in Example 1, the insulation resistance was 2000Ω.

Comparative Example 4

The same operation as in Example 1 was carried oat, except that the acid to be added to the conductive film removal agent was changed to basic ammonium water (boiling point under atmospheric pressure: 38° C.). When the appearance of the surface to which the removal agent was applied was evaluated in the same manner as in Example 1 after the washing operation, it was found that the lower layer of the conductive film was not removed and the residue remained on the base material. When the insulation resistance of the surface to which the removal agent was applied was evaluated in the same manner as in Example 1, it was 1000Ω.

Example 26

In a container, 70 g of ethylene glycol (manufactured by Wako Pure Chemical Industries, Ltd.) and 30 g of N,N'-dimethylpropyleneurea (manufactured by Tokyo Chemical Industry Co., Ltd.) were added and mixed, and 5 g of Polyquaternium-11 (manufactured by ISP Japan) and 0.5 g of Aerosil R 812S as a thixotropic agent (manufactured by Nippon Aerosil Co., Ltd., silica fine particles, average primary particle diameter: about 7 nm) were added further and stirred for 30 minutes while being heated at 60° C. in an oil bath. Next, the container was taken out of the oil bath and left standing to cool to room temperature and thereafter, 0.5 g of a leveling agent (F-555, manufactured by DIC Corporation) and 4 g of sulfuric acid (manufactured by Wako Pure Chemical Industries, concentration 98%) were added and stirred for 15 minutes. The obtained solution was filtered by a membrane filter (manufactured by Millipore, Omnipore Membrane PTFE, nominal diameter 0.45 μm) to obtain a conductive film removal agent. When the same operation as in Example 1 was carried out by using the obtained conductive film removal agent and the appearance of the conductive film-removed face was evaluated, no residue was observed and the appearance was good. When the insulation resistance of the conductive film-removed part was measured in the same manner as in Example 1, the insulation resistance was 40 MΩ or higher.

When the conductive film removal line width was evaluated by the method described in (2) using a conductive film-bearing base material (8'8% permeability at 550 nm and 860 Ω/square surface resistance) obtained by forming a thin film of double-wall carbon nanotubes (DWCNTs), a fibrous conductor, on a PET film with a size of 21×15 cm and a thickness of 188 μm, it was 100 μm. When the line straightness (undulation) of the etching boundary part was evaluated by the method described in (3), the standard deviation (σ) was 10 or less.

Example 27

A patterned conductive film-bearing base material was obtained by the same operation as in Example 26, except that the acid added to the conductive film removal agent was changed to 10 g of p-toluenesulfonic acid monohydrate (manufactured by Tokyo Chemical Industry Co., Ltd., boiling point under atmospheric pressure: 103 to 106° C.) and the heating time by an infrared oven was changed to 5 minutes. When the appearance of the conductive film-removed face was evaluated in the same manner as in Example 1, no residue was observed and the appearance was good. When the insulation resistance of the conductive film-removed part was measured in the same manner as in Example 1, the insulation resistance was 40 MΩ or higher. Further, the conductive film removal line width and the line straightness of the etching boundary part were evaluated in the same manner as in Example 26 and consequently, it was found that the conductive film removal line width was 100 μm and the standard deviation (σ) was 5 or less.

Example 28

A patterned conductive film-bearing base material was obtained by the same operation as in Example 26, except that 5 g of sodium nitrate (manufactured by Wako Pure Chemical Industries, Ltd.) was added to the conductive film removal agent and the heating time by an infrared oven was changed to 3 minutes. When the appearance of the conductive film-removed face was evaluated in the same manner as in Example 1, no residue was observed and the appearance was good. When the insulation resistance of the conductive film-removed part was measured in the same manner as in Example 1, the insulation resistance was 40 MΩ or higher. Further, the conductive film removal line width and the line straightness of the etching boundary part were evaluated in the same manner as in Example 26 and consequently, it was found that the conductive film removal line width was 50 μm and the standard deviation (σ) was 10 or less.

Example 29

A patterned conductive film-bearing base material was obtained by the same operation as in Example 26, except that the acid added to the conductive film removal agent was changed to 10 g of p-toluenesulfonic acid monohydrate and further 5 g of sodium nitrate was added and the heating time by an infrared oven was changed to 3 minutes. When the appearance of the conductive film-removed face was evaluated in the same manner as in Example 1, no residue was observed and the appearance was good. When the insulation resistance of the conductive film removed part was measured in the same manner as in Example 1, the insulation resistance was 40 MΩ or higher. Further, the conductive film removal line width and the line straightness of the etching boundary part were evaluated in the same manner as in Example 26 and consequently, it was found that the conductive film removal line width was 30 μm and the standard deviation (σ) was 5 or less.

Example 30

A patterned conductive film-bearing base material was obtained by the same operation as in Example 2'6, except that the conductive film-bearing base material was changed to a glass substrate with a thickness of 0.7 mm, the acid added to the conductive film removal agent was changed to 4 g of phenolsulfonic acid (manufactured by Tokyo Chemical Industry Co., Ltd., solid: decomposition temperature: 180° C. or higher), the thixotropic agent was changed to 0.5 g of Aerosil 300 (manufactured by Nippon Aerosil Co., Ltd., silica fine particles, average primary particle diameter: about 7 nm), and further, 5 g of potassium nitrate (manufactured by Wako Pure Chemical Industries, Ltd.) was added, and the heating time by an infrared oven was changed to 3 minutes. When the appearance of the conductive film-removed face was evaluated in the same manner as in Example 1, no residue was observed and the appearance was good. When the insulation resistance of the conductive film-removed part was measured in the same manner as in Example 1, the insulation resistance was 40 MΩ or higher. Further, the conductive film removal line width and the line straightness of the etching boundary part were evaluated in the same manner as in Example 26 and consequently, it was found that the conductive film removal line width was 30 μm and the standard deviation (σ) was 5 or less.

Example 31

A patterned conductive film-bearing base material was obtained by the same operation as in Example 26, except that the conductive layer of the conductive film-bearing base material was changed to graphene formed by the method described in The Journal of Physical Chemistry B, vol. 110, pp. 85.35-8539 (2006), the resin to be added to the conductive film removal agent was changed to Polyquaternium-10, and the thixotropic agent was changed to 0.5 g of Thixatrol MAX (manufactured by Elementis Japan Co., Ltd., a polyester amide derivative). When the appearance of the conductive film-removed face was evaluated in the same manner as in Example 1, no residue was observed and the appearance was good. When the insulation resistance of the conductive film-removed part was measured in the same manner as in Example 1, the Insulation resistance was 40 MΩ or higher. Further, the conductive film removal line width and the line straightness of the etching boundary part were evaluated in the same manner in Example 26 and consequently, it was found that the conductive film removal line width was 100 μm and the standard deviation (σ) was 10 or less.

Example 32

A patterned conductive film-bearing base material was obtained by the same operation as in Example 31, except that the acid added to the conductive film removal agent was changed to 10 g of benzenesulfonic acid (manufactured by Tokyo Chemical Industry Co., Ltd., solid: decomposition temperature 200° C. or higher), the resin was changed to 3 g of hydroxyethyl cellulose (manufactured by Daicel Chemical Industries, Ltd.), the thixotropic agent was changed to 0.5 g of BYK-405 (manufactured by BYK Japan, polycarboxylic acid amide); and further 5 g of sodium nitrate was added, the heating time by an infrared oven was changed to 3 minutes, the washing liquid was changed to pure water heated to 80° C., and the washing time was changed to 10 minutes. When the appearance of the conductive film-removed face was evaluated in the same manner as in Example 1, no residue was observed and the appearance was good. When the insulation resistance of the conductive film-removed part was measured in the same manner as in Example 1, the insulation resistance was 40 MΩ or higher. Further, the conductive film removal line width and the line straightness of the etching boundary part were evaluated in the same manner as in Example 28 and consequently, it was found that the conductive film removal line width was 50 μm and the standard deviation (σ) was 5 or less.

Example 33

A patterned conductive film-bearing base material was obtained by the same operation as in Example 31, except that 5 g of sodium nitrite (manufactured by Wako Pure Chemical Industries, Ltd.) was added to the conductive film removal agent and the heating time by an infrared oven was changed to 3 minutes. When the appearance of the conductive film-removed face was evaluated in the same manner as in Example 1, no residue was observed and the appearance was good. When the insulation resistance of the conductive film-removed part was measured in the same manner as in Example 1, the insulation resistance was 40 MΩ or higher. Further, the conductive film removal line width and the line straightness of the etching boundary part were evaluated in the same manner as in Example 26 and consequently, it was found that the conductive film removal line width was 100 μm and the standard deviation (σ) was 10 or less.

Example 34

A patterned conductive film-bearing base material was obtained by the same operation as in Example 26, except that the conductive film of the conductive film-bearing base material was changed to silver nano-wires synthesized by the method: described in Chemistry of Materials, vol. 14, pp. 4736-4745 (2002), the resin to be added to the conductive film removal agent was changed to Polyquaternium-10, and the thixotropic agent was changed to 0.5 g of Thixatrol MAX. When the appearance of the conductive film-removed face was evaluated in the same manner as in Example 1, 10 to 20 residues with an outer circumference of 0.01 mm or more were observed. When the insulation resistance of the conductive film-removed part was measured in the same manner as in Example 1, the insulation resistance was 20 MΩ or lower. Further, the conductive film removal line width and the line straightness of the etching boundary part were evaluated in the same manner as in Example 26 and consequently, it was found that the conductive film removal line width was 500 μm and the standard deviation (σ) was 30 or less.

Example 35

A patterned conductive film-bearing base material was obtained by the same operation as in Example 34, except that 5 g of sodium nitrate was added to the conductive film removal agent and the heating time by an infrared oven was changed to 3 minutes. When the appearance of the conductive film-removed face was evaluated in the same manner as in Example 1, no residue was observed and the appearance was good. When the insulation resistance of the conductive film-removed part was measured in the same manner as in Example 1, the insulation resistance was 40 MΩ or higher. Further, the conductive film removal line width and the line straightness of the etching boundary part were evaluated in the same manner as in Example 26 and consequently, it was found that the conductive film removal line width was 100 μm and the standard deviation (σ) was 10 or less.

Example 36

A patterned conductive film-bearing base material was obtained by the same operation as in Example 34, except that the acid added to the conductive film removal agent was changed to 10 g of p-toluenesulfonic acid monohydrate and further 5 g of sodium nitrate was added and the heating time by an infrared oven was changed to 3 minutes. When the appearance of the conductive film-removed face was evaluated in the same manner as in Example 1, no residue was observed and the appearance was good. When the insulation resistance of the conductive film-removed part was measured in the same manner as in Example 1, the insulation resistance was 40 MΩ or higher. Further, the conductive film removal line width and the line straightness of the etching boundary part were evaluated in the same manner as in Example 26 and consequently, it was found that the conductive film removal line width was 30 μm and the Standard deviation (σ) was 5 or less.

Example 37

A patterned conductive film-bearing base material was obtained by the same operation as in Example 26, except that the conductive layer of the conductive film-bearing base material was changed to a copper whisker formed by the method described in Japanese Patent Application Laid-Open (JP-A) No. 2002-266007, the resin to be added to the conductive film removal agent was changed to Polyquaternium-10, and the thixotropic agent was changed to Thixatrol MAX. When the appearance of the conductive film-removed face was evaluated in the same manner as in Example 1, 10 to 20 residues with an outer circumference of 0.01 mm or more were observed. When the insulation resistance of the conductive film-removed part was measured in the same manner as in Example 1, the insulation resistance was 40 MΩ or higher. Further, the conductive film removal line width and the line straightness of the etching boundary part were evaluated in the same manner as in Example 26 and consequently, it was found that the conductive film removal line width was 100 μm and the standard deviation (σ) was 10 or less.

Example 38

A patterned conductive film-bearing base material was obtained by the same operation as in Example 26, except that the conductive layer of the conductive film-bearing base material was changed to a copper nanowire formed by the method described in Japanese Patent Application Laid-Open (JP-A) No. 2002-266007, the acid contained in the conductive film removal agent was changed to 10 g of p-toluenesulfonic acid monohydrate, the resin was changed to Polyquaternium-10, the thixotropic agent was changed to Thixatrol MAX, and further 5 g of sodium nitrate was added, and the heating time by an infrared oven was changed to 3 minutes. When the appearance of the conductive film-removed face was evaluated in the same manner as in Example 1, no residue was observed and the appearance was good. When the insulation resistance of the conductive film-removed part was measured in the same manner as in Example 1, the insulation resistance was 40 MΩ or higher. Further, the conductive film removal line width and the line straightness of the etching boundary part were evaluated in the same manner as in Example 26 and consequently, it was found that the conductive film removal line width was 30 μm and the standard deviation (σ) was 5 or less.

Comparative Example 5

The same operation as in Example 26 was carried out, except that 5 g of sodium nitrate was added to the conductive film removal agent and no acid was added further. When the appearance of the conductive film-removed face was evaluated in the same manner as in Example 1, the conductive film was not removed and the resistance value was 860Ω.

The compositions and evaluation results of respective examples and comparative examples are shown in Tables 1 to 4.

TABLE 1

| | Condition | | | | |
| --- | --- | --- | --- | --- | --- |
| | Conductive film removal agent | | | | Conductive film-bearing base material |
| | Acid or base Acid/base generation agent (Addition amount) | Resin | Leveling agent | Coating thickness | Conductive film |
| Example 1 | Sulfuric acid (4 g) | Polyquaternium-10 | F-477 | 2.4 μm | CNT |
| Example 2 | Sulfuric acid (1 g) | Polyquaternium-10 | F-477 | 2.4 μm | CNT |
| Example 3 | Sulfuric acid (0.5 g) | Polyquaternium-10 | F-477 | 2.4 μm | CNT |
| Example 4 | Sulfuric acid (4 g) | Polyquaternium-10 | F-477 | 2.4 μm | CNT |
| Example 5 | Sulfuric acid (4 g) | Carboxymethyl cellulose | F-477 | 2.4 μm | CNT |
| Example 6 | Sulfuric acid (4 g) | Polyvinylpyrrolidone | F-477 | 2.4 μm | CNT |
| Example 7 | Nitric acid (4 g) | Polyquaternium-10 | F-477 | 2.4 μm | CNT |
| Example 8 | Acetic acid (4 g) | Polyquaternium-10 | F-477 | 2.4 μm | CNT |
| Example 9 | Nitric acid (4 g) | Polyquaternium-10 | F-477 | 2.4 μm | CNT |
| Example 10 | Acetic acid (4 g) | Polyquaternium-10 | F-477 | 2.4 μm | CNT |
| Example 11 | Sulfuric acid (4 g) | Polyquaternium-10 | F-477 | 2.4 μm | CNT |
| Example 12 | Sulfuric acid (4 g) | Polyquaternium-10 | F-477 | 2.4 μm | CNT |
| Example 13 | Sulfuric acid (4 g) | Polyquaternium-10 | F-477 | 0.1 μm | CNT |
| Example 14 | Sulfuric acid (4 g) | Polyquaternium-10 | F-477 | 200 μm | CNT |
| Example 15 | 2-Ethanolamine (4 g) | Polyquaternium-10 | F-477 | 2.4 μm | CNT |

| | Condition | | Results | |
| --- | --- | --- | --- | --- |
| | Conductive film-bearing base material Supporting base material | Heat treatment condition | Appearance of conductive film-removed face | Insulation resistance of etching part (DC 25 V application) |
| Example 1 | PET film | 130° C./5 min | Good (evenly removed in entire face) | 40 MΩ or higher |
| Example 2 | PET film | 150° C./5 min | Good (evenly removed in entire face) | 40 MΩ or higher |
| Example 3 | PET film | 130° C./30 min | Good (evenly removed in entire face) | 40 MΩ or higher |
| Example 4 | PET film | 80° C./60 min | Good (evenly removed in entire face) | 40 MΩ or higher |
| Example 5 | PET film | 130° C./5 min | Good (evenly removed in entire face) | 40 MΩ or higher |
| Example 6 | PET film | 130° C./5 min | Good (evenly removed in entire face) | 40 MΩ or higher |
| Example 7 | PET film | 80° C./15 min | Good (A little residue remained) | 40 MΩ or higher |
| Example 8 | PET film | 100° C./15 min | Good (A little residue remained) | 40 MΩ or higher |
| Example 9 | PET film | 80° C./60 min | Good (A little residue remained) | 40 MΩ or higher |
| Example 10 | PET film | 80° C./60 min | Good (A little residue remained) | 40 MΩ or higher |
| Example 11 | Glass substrate | 130° C./5 min | Good (evenly removed in entire face) | 40 MΩ or higher |

TABLE 1-continued

| | | | | |
|---|---|---|---|---|
| Example 12 | Polycarbonate | 130° C./5 min | Good (evenly removed in entire face) | 40 MΩ or higher |
| Example 13 | PET film | 130° C./30 min | Good (A little residue remained) | 40 MΩ or higher |
| Example 14 | PET film | 130° C./5 min | Good (evenly removed in entire face) | 40 MΩ or higher |
| Example 15 | PET film | 130° C./30 min | Good (A little residue remained) | 40 MΩ or higher |

TABLE 2

| | Condition | | | | |
|---|---|---|---|---|---|
| | Conductive film removal agent | | | | Conductive film-bearing base material |
| | Acid or base Acid/base generation agent (Addition amount) | Resin | Leveling agent | Coating thickness | Conductive film |
| Example 16 | Thermal acid generator 1 (4 g) | Polyquaternium-10 | F-477 | 2.4 μm | CNT |
| Example 17 | Thermal acid generator 2 (4 g) | Polyquaternium-10 | F-477 | 2.4 μm | CNT |
| Example 18 | Thermal base generator 1 (4 g) | Polyquaternium-10 | F-477 | 2.4 μm | CNT |
| Example 19 | Sulfuric acid (4 g) | Polyquaternium-10 | F-477 | 2.4 μm | Antimony-doped tin oxide-sputtered film |
| Example 20 | Sulfuric acid (4 g) | Polyquaternium-10 | F-477 | 2.4 μm | Copper-plated film |
| Example 21 | Sulfuric acid (4 g) | Polyquaternium-10 | F-477 | 2.4 μm | Whisker-like antimony-doped tin oxide |
| Example 22 | Sulfuric acid (4 g) | Polyquaternium-10 | F-477 | 2.4 μm | Granular ITO |
| Example 23 | Sulfuric acid (4 g) | Polyquaternium-10 | F-477 | 2.4 μm | Overcoat-bearing CNT |
| Example 24 | Sulfuric acid (4 g) | Polyallylamine | F-477 | 2.4 μm | CNT |
| Example 25 | Sulfuric acid (4 g) | Guar hydroxypropyl trimonium chloride | Ftergent 750FL | 2.4 μm | CNT |
| Comparative Example 1 | Sulfuric acid (4 g) | None | F-477 | 1.8 μm | CNT |
| Comparative Example 2 | Sulfuric acid (4 g) | Polyquaternium-10 | None | 2.4 μm | CNT |
| Comparative Example 3 | Dimethylacetamide (4 g) | None | None | 2.4 μm | CNT |
| Comparative Example 4 | Ammonia water (4 g) | Polyquaternium-10 | F-477 | 2.4 μm | CNT |

| | Condition | | Results | |
|---|---|---|---|---|
| | Conductive film-bearing base material Supporting base material | Heat treatment condition | Appearance of conductive film-removed face | Insulation resistance of etching part (DC 25 V application) |
| Example 16 | PET film | 130° C./30 min | Good (A little residue remained) | 40 MΩ or higher |
| Example 17 | PET film | 130° C./30 min | Good (A little residue remained) | 40 MΩ or higher |
| Example 18 | PET film | 130° C./30 min | Good (A little residue remained) | 40 MΩ or higher |
| Example 19 | PET film | 130° C./30 min | Good (A little residue remained) | 40 MΩ or higher |
| Example 20 | PET film | 130° C./30 min | Good (A little residue remained) | 40 MΩ or higher |
| Example 21 | PET film | 130° C./30 min | Good (evenly removed in entire face) | 40 MΩ or higher |
| Example 22 | PET film | 130° C./30 min | Good (evenly removed in entire face) | 40 MΩ or higher |
| Example 23 | PET film | 130° C./5 min | Good (evenly removed in entire face) | 40 MΩ or higher |
| Example 24 | PET film | 130° C./5 min | Good (evenly removed in entire face) | 40 MΩ or higher |
| Example 25 | PET film | 130° C./5 min | Good (evenly removed in entire face) | 40 MΩ or higher |
| Comparative Example 1 | PET film | 130° C./5 min | Defective (Partial conduction) | 1200 Ω |

TABLE 2-continued

| | | | | |
|---|---|---|---|---|
| Comparative Example 2 | PET film | 130° C./5 min | Defective (Much residue remained) | 40 MΩ or higher |
| Comparative Example 3 | PET film | 130° C./30 min | Defective (Partial conduction) | 2000 Ω |
| Comparative Example 4 | PET film | 130° C./5 min | Defective (Film remained) | 1000 Ω |

TABLE 3

| | Condition Conductive film removal agent | | | |
|---|---|---|---|---|
| | Acid (Addition amount) | Nitrate/nitrite (Addition amount) | Resin (Addition amount) | Leveling agent (Addition amount) |
| Example 26 | Sulfuric acid (4 g) | None | Polyquaternium-11 (5 g) | F-555 (0.5 g) |
| Example 27 | p-Toluenesulfonic acid monohydrate (10 g) | None | Polyquaternium-11 (5 g) | F-555 (0.5 g) |
| Example 28 | Sulfuric acid (4 g) | Sodium nitrate (5 g) | Polyquaternium-11 (5 g) | F-555 (0.5 g) |
| Example 29 | p-Toluenesulfonic acid monohydrate (10 g) | Sodium nitrate (5 g) | Polyquaternium-11 (5 g) | F-555 (0.5 g) |
| Example 30 | Phenolsulfonic acid (4 g) | Potassium nitrate (5 g) | Polyquaternium-11 (5 g) | F-555 (0.5 g) |
| Example 31 | Sulfuric acid (4 g) | None | Polyquaternium-10 (5 g) | F-555 (0.5 g) |
| Example 32 | Benzenesulfonic acid (10 g) | Sodium nitrate (5 g) | Hydroxyethyl cellulose (3 g) | F-555 (0.5 g) |
| Example 33 | Sulfuric acid (4 g) | Sodium nitrite (5 g) | Polyquaternium-10 (5 g) | F-555 (0.5 g) |
| Example 34 | Sulfuric acid (4 g) | None | Polyquaternium-10 (5 g) | F-555 (0.5 g) |
| Example 35 | Sulfuric acid (4 g) | Sodium nitrate (5 g) | Polyquaternium-10 (5 g) | F-555 (0.5 g) |
| Example 36 | p-Toluenesulfonic acid monohydrate (10 g) | Sodium nitrate (5 g) | Polyquaternium-10 (5 g) | F-555 (0.5 g) |
| Example 37 | Sulfuric acid (4 g) | None | Polyquaternium-10 (5 g) | F-555 (0.5 g) |
| Example 38 | p-Toluenesulfonic acid monohydrate (10 g) | Sodium nitrate (5 g) | Polyquaternium-10 (5 g) | F-555 (0.5 g) |
| Comparative Example 5 | None | Sodium nitrate (5 g) | Polyquaternium-11 (5 g) | F-555 (0.5 g) |

| | Condition | | |
|---|---|---|---|
| | Conductive film-bearing base material | | Heat treatment at 130° C. |
| | Conductive film | Supporting base material | Heating time |
| Example 26 | CNT | PET film | 10 min |
| Example 27 | CNT | PET film | 5 min |
| Example 28 | CNT | PET film | 3 min |
| Example 29 | CNT | PET film | 3 min |
| Example 30 | CNT | Glass | 3 min |
| Example 31 | Graphene | PET film | 10 min |
| Example 32 | Graphene | PET film | 3 min |
| Example 33 | Graphene | PET film | 3 min |
| Example 34 | Silver nanowire | PET film | 10 min |
| Example 35 | Silver nanowire | PET film | 3 min |
| Example 36 | Silver nanowire | PET film | 3 min |
| Example 37 | Copper whisker | PET film | 10 min |
| Example 38 | Silver nanowire | PET film | 3 min |
| Comparative Example 5 | CNT | PET film | 10 min |

TABLE 4

| | Results | | | |
|---|---|---|---|---|
| | Appearance of conductive film-removed face | Insulation resistance of etching part (DC 25 V application) | Conductive film removal Line width | Line straightness of etching boundary part (Standard deviation σ) |
| Example 26 | Good (evenly removed in entire face) | 40 MΩ or higher | 100 μm | ≤10 |
| Example 27 | Good (evenly removed in entire face) | 40 MΩ or higher | 100 μm | ≤5 |

TABLE 4-continued

| | Results | | | |
|---|---|---|---|---|
| | Appearance of conductive film-removed face | Insulation resistance of etching part (DC 25 V application) | Conductive film removal Line width | Line straightness of etching boundary part (Standard deviation σ) |
| Example 28 | Good (evenly removed in entire face) | 40 MΩ or higher | 50 μm | ≤10 |
| Example 29 | Good (evenly removed in entire face) | 40 MΩ or higher | 30 μm | ≤5 |
| Example 30 | Good (evenly removed in entire face) | 40 MΩ or higher | 30 μm | ≤5 |
| Example 31 | Good (evenly removed in entire face) | 40 MΩ or higher | 100 μm | ≤10 |
| Example 32 | Good (evenly removed in entire face) | 40 MΩ or higher | 50 μm | ≤5 |
| Example 33 | Good (evenly removed in entire face) | 40 MΩ or higher | 100 μm | ≤10 |
| Example 34 | Good (A little residue remained) | 20 MΩ or lower | 500 μm | ≤30 |
| Example 35 | Good (evenly removed in entire face) | 40 MΩ or higher | 100 μm | ≤10 |
| Example 36 | Good (evenly removed in entire face) | 40 MΩ or higher | 30 μm | ≤5 |
| Example 37 | Good (A little residue remained) | 40 MΩ or higher | 100 μm | ≤10 |
| Example 38 | Good (evenly removed in entire face) | 40 MΩ or higher | 30 μm | ≤5 |
| Comparative Example 5 | Impossible to remove | 860 Ω | Impossible to remove | — |

DESCRIPTION OF REFERENCE SIGNS

101: Base material
102: Conductive film
103: Conductive film removal agent
104: Conductive film-removed part

The invention claimed is:

1. A conductive film removal agent comprising an acid having a boiling point of 80° C. or higher, or a base having a boiling point of 80° C. or higher, or a compound which generates an acid or a base by external energy in combination with a solvent, a resin containing a quaternary amino group in a part of the structure thereof, and a leveling agent, wherein the resin is a cationic resin.

2. The conductive film removal agent according to claim 1, wherein the acid having a boiling point of 80° C. or higher is sulfuric acid or a sulfonic acid compound.

3. The conductive film removal agent according to claim 1, comprising the acid having a boiling point of 80° C. or higher or a compound which generates an acid by external energy and further comprising a nitrate or a nitrite.

4. The conductive film removal agent according to claim 1, wherein the cationic resin is a resin containing any one of primary to quaternary amino groups in a part of the structure thereof.

5. The conductive film removal agent of claim 1, wherein the resin containing a quaternary amino group comprises: polydimethyldiallylammonium chloride, guar hydroxypropyltrimonium chloride, polyquaternium-4, polyquaternium-6, polyquaternium-7, polyquaternium-10, polyquaternium-11, polyquaternium-16, polyquaternium-28, polyquaternium-32, polyquaternium-37, polyquaternium-39, polyquaternium-51, polyquaternium-52, polyquaternium-44, polyquaternium-46, polyquaternium-55, or polyquaternium-68.

6. A conductive film removal method comprising the steps of:
applying the conductive film removal agent as claimed in claim 5 to at least a portion of a conductive film-bearing base material having a conductive film containing a whisker-like conductor, a fibrous conductor, or a granular conductor on the base material;
carrying out heat treatment at 80° C. or higher; and
removing the conductive film by washing using a liquid.

7. A conductive film removal method comprising:
applying the conductive film removal agent as claimed in claim 1 to at least a portion of a conductive film-bearing base material having a conductive film containing a whisker-like conductor, a fibrous conductor, or a granular conductor on the base material;
carrying out heat treatment at 80° C. or higher; and
removing the conductive film by washing using a liquid.

8. The conductive film removal method according to claim 7, wherein the fibrous conductor is a carbon nanotube.

9. The conductive film removal method according to claim 7, wherein the conductive film removal agent is applied so that a thickness after drying be 0.1 to 200 μm.

10. The conductive film removal method according to claim 7 for removing, from the conductive film-bearing base material having an overcoat layer on the conductive film, the overcoat layer and the conductive film.

11. A patterning method of a conductive film for forming a desired pattern by selectively removing the conductive film by the conductive film removal method according to claim 7.

* * * * *